United States Patent
Wu et al.

(10) Patent No.: US 7,348,861 B1
(45) Date of Patent: Mar. 25, 2008

(54) METHOD AND APPARATUS FOR A CRYSTAL OSCILLATOR TO ACHIEVE FAST START-UP TIME, LOW POWER AND FREQUENCY CALIBRATION

(75) Inventors: I-chang Wu, Fremont, CA (US); Chung Wen Lo, Palo Alto, CA (US); Keng Leong Fong, Sunnyvale, CA (US)

(73) Assignee: Ralink Technology, Inc., Cupertino, CA (US)

( * ) Notice: Subject to any disclaimer, the term of this patent is extended or adjusted under 35 U.S.C. 154(b) by 10 days.

(21) Appl. No.: 11/095,630

(22) Filed: Mar. 31, 2005

(51) Int. Cl.
*H03B 5/32* (2006.01)
*H03L 5/00* (2006.01)

(52) U.S. Cl. .................. 331/158; 331/36 C; 331/183
(58) Field of Classification Search ............ 331/116 R, 331/116 FE, 158, 183, 36 C
See application file for complete search history.

(56) References Cited

U.S. PATENT DOCUMENTS

| | | | |
|---|---|---|---|
| 5,534,826 A * | 7/1996 | Logan | 331/158 |
| 5,805,027 A | 9/1998 | Yin | |
| 5,844,448 A | 12/1998 | Jackoski et al. | |
| 5,982,246 A | 11/1999 | Hofhine et al. | |
| 6,057,742 A | 5/2000 | Prado | |
| 6,563,391 B1 * | 5/2003 | Mar | 331/116 R |
| 6,710,669 B2 * | 3/2004 | Hasegawa et al. | 331/177 V |
| 6,943,639 B2 * | 9/2005 | Dahlin | 331/183 |
| 7,019,595 B1 | 3/2006 | Lo et al. | |
| 7,197,094 B2 | 3/2007 | Tung | |
| 7,245,677 B1 | 7/2007 | Pare, Jr. | |
| 7,248,650 B1 | 7/2007 | Tung et al. | |
| 7,266,146 B2 | 9/2007 | Pare, Jr. et al. | |
| 2005/0225405 A1 * | 10/2005 | Tateyama | 331/158 |
| 2007/0030085 A1 * | 2/2007 | Brennan et al. | 331/177 V |

\* cited by examiner

*Primary Examiner*—Robert Pascal
*Assistant Examiner*—James Goodley
(74) *Attorney, Agent, or Firm*—Law Offices of Imam

(57) ABSTRACT

One embodiment of the present invention includes a frequency generation circuit including a control module, an oscillator circuit coupled to the control module, the oscillator circuit having a start-up time defined by the time required to reach a desired frequency. The oscillator circuit includes an amplifier having an input and an output and being programmably-alterable by the control module, a first capacitor coupled to the input of the amplifier and being programmably-alterable, in capacitance, by the control module, a second capacitor coupled to the output of the amplifier, a crystal resonator coupled to the first and second capacitors for generating an output signal having a desired frequency, wherein fast start-up time is achieved.

20 Claims, 4 Drawing Sheets

METHOD AND APPARATUS FOR A CRYSTAL OSCILLATOR TO ACHIEVE FAST START-UP TIME, LOW POWER AND FREQUENCY CALIBRATION

BACKGROUND OF THE INVENTION

1. Field of the Invention

This invention relates generally to the field of crystal oscillators and particularly to accelerating the crystal oscillator's start-up time, thereby reducing its power consumption while calibrating the crystal oscillating frequency.

2. Description of the Prior Art

Crystal oscillators are commonly employed in electronic circuitry and particularly used for generating a system clock for a synchronous system, such as a computer or communication systems. Crystal oscillators are generally expensive and even more so when they are of higher frequencies. Crystal oscillators are generally measured in parts per million (or ppm) as a measure of the accuracy of their oscillating frequency relative to a desired frequency. That is, for example, the larger the ppm, the less accuracy, hence, the lower the cost of the oscillator. Therefore, inexpensive oscillators, for use in high-performance prior art systems, often require fine calibration to meet, system-specified, small ppm requirements.

In addition, crystal oscillators generally yield slow 'start-up times', which is defined by the duration of time required for the oscillator circuit to generate a stable and desired frequency from the time of power on. Slow start-up times do not allow for rather frequent shut-off of the crystal oscillator when used in systems that enter, rather frequently, sleep or 'deep sleep' modes to reduce power consumption. That is, clearly, the more a circuit is in an inoperational mode, i.e. deep sleep, the less power the system will consume.

Therefore, the need arises for an inexpensive crystal oscillator to be used in an oscillator circuit capable of fast start-up time, accurate frequency calibration and low power due to frequent occurrences of 'deep sleep' mode.

SUMMARY OF THE INVENTION

Briefly, one embodiment of the present invention includes a frequency generation circuit including a control module, an oscillator circuit coupled to the control module. The oscillator circuit includes an amplifier, a first capacitor coupled to the input of the amplifier and being programmable, in capacitance, by the control module, a second capacitor coupled to the output of the amplifier, a crystal resonator coupled to the input and output of the amplifier for generating an output signal having a desired frequency, wherein an inexpensive resonator, crystal or otherwise, is used as part of the crystal oscillator to achieve fast start-up time and accurate frequency calibration while using an inexpensive crystal resonator.

IN THE DRAWINGS

DETAILED DESCRIPTION OF THE PREFERRED EMBODIMENT

Figure 1:
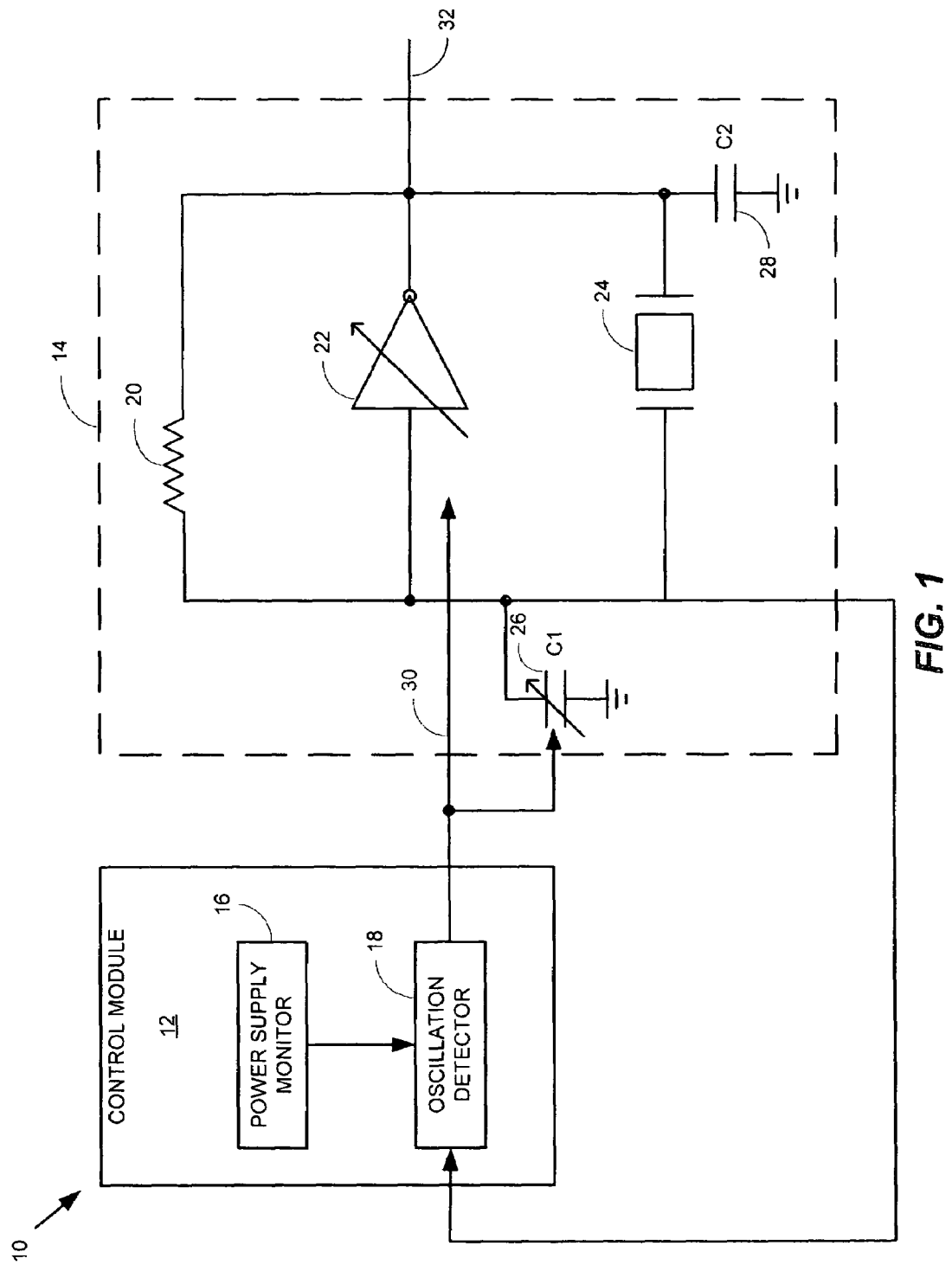
FIG. 1 shows a frequency generation circuit 10 in accordance with an embodiment of the present invention.

Referring now to FIG. 1, a frequency generation circuit 10 is shown to include a control module 12 coupled to an oscillator circuit 14 in accordance with an embodiment of the present invention. The control module 12 is shown to include a power supply monitor 16 coupled to an oscillation detector 18. The oscillation circuit 14 is shown to include a feedback resistor 20, an amplifier 22, a C1 capacitor 26, a crystal resonator 24 and a C2 capacitor 28. The driving current of the amplifier 22 is programmable for reasons that will become apparent shortly. The feedback resistor 20 is shown coupled, on one end, to the output of the amplifier 22 and an opposite end to the input of the amplifier 22. The input of the amplifier 22 is further shown coupled to the oscillation detector 18. The C2 capacitor 28 is shown coupled at one end to the crystal resonator 24 and to the output of the amplifier 22, generating the signal 32, and at another end to ground. The C1 capacitor 26 is shown coupled, at one end, to the input of the amplifier 22 and the crystal resonator 24 and at another end to ground.

The frequency generation circuit 10, through the crystal resonator 24, generates the output signal 32, as a system clock, for use by other circuits in a synchronous system, such as one requiring a system clock for synchronization or other reasons. The accuracy of the frequency of the output signal 32 is hence important to other circuits using the same because this frequency is often used to sample other frequencies and/or generate signals that, in turn, need to be reliable. Furthermore, the start-up time, as described earlier, is important as this start-up time, in part, determines system performance of circuits utilizing the output signal 32. Finally, low power consumption is desired and realized by the frequency generation circuit 10.

In the embodiment of FIG. 1, the amplifier 22 is an inverting amplifier or a phase shift amplifier transforming the phase shift of a received signal by 180 degrees. In the embodiment of FIG. 1, the C1 capacitor 26 is a variable or programmable capacitor, the capacitance of which is alterable while the C2 capacitor 28 is fixed. The C1 capacitor 26 and the C2 capacitor 28 are commonly known as load capacitors. For reasons that will be apparent shortly, the C1 capacitor 26 is designed to be programmable for optimizing the start-up time of the frequency generation circuit 10 and for frequency calibration as well. The programmability of the C1 capacitor 26 and of the amplifier 22 is digitally controlled by the oscillation detector 18 to calibrate the desired frequency, which the output signal 32 ultimately achieves.

The oscillation detector 18 is shown to generate an output, a control signal 30, which serves as input to the oscillation circuit 14 and particularly to the C1 capacitor 26 and the amplifier 22 by monitoring the oscillating signal condition at the input of the amplifier 22. The oscillation detector 18 detects the oscillating signal condition and programs the C1 capacitor 26 and the amplifier 22.

The start-up time of the oscillator circuit 14 is strongly dependent on the ratio of the values of the C2 capacitor 28 and the C1 capacitor 26. Specifically, the ratio C2/C1 with C2 being the capacitance of the C2 capacitor 28 and C1 being the capacitance of the C1 capacitor 26, and the drivability of the amplifier 22 determines the start-up time of the oscillator circuit 14. That is, the higher or larger the ratio C2/C1, the shorter the start-up time. Similarly, the higher the drivability of the amplifier 22, the shorter the start-up time. Achieving short start-up times is increasingly important as circuits utilizing crystal oscillators benefit substantially in system improvement. This is true for both initial power-on of a system as well as becoming operational after a 'deep sleep' mode, i.e. the system waking up from a mode during which it is essentially not operational and having been driven to the latter state due to lack of utilization of the system for a fairly long and predetermined duration of time.

To provide practical examples of such performance improvement, a crystal oscillator circuit used in a portable electronic device, such as a cellular phone, is periodically placed in 'sleep' mode. In 'sleep' mode, little or no power is supplied to various components of the electronic device, furthermore, the clock signal, generated by the crystal oscillator, is not utilized whenever use of the electronic device is deemed inoperational for a predetermined period of time. As soon as use of the electronic device is detected, it is clearly important for the device to wake up (or become operational) as quickly as possible. This is an example of a situation requiring fast or short start-up times. There are numerous others that will not be listed herein in the interest of brevity.

In the embodiment of FIG. 1, the power supply monitor 16 monitors the power supply condition. Once the power-on is detected, the C2/C1 ratio is initially set to a large value in order to shorten the start-up time of the oscillator circuit 14. To achieve fast start-up time, the C1 capacitor 26 is first programmed to be at a low capacitance value and the amplifier 22 is set to high current (high drive). As detection of change of oscillation condition is noted, the oscillation detector 18 programs the capacitance of the C1 capacitor 26 to change, through the control signal 30, so as to gradually program the capacitance to higher values and to ultimately a preset calibrated value for the desired frequency at the output signal 32 while the amplification of the amplifier 22 is programmed to lower current by the oscillation detector 18 through the control signal 30. This, in turn, causes low power operation of the frequency generation circuit 10 and high quality performance. Furthermore, this allows use of inexpensive and conventional crystal resonators, such as the resonator 24, which is 20 parts per million (ppm). Note that the programmability of the C1 capacitor 26 is also used to calibrate the frequency thereby increasing frequency accuracy to less than 5 ppm. The calibrated value of C1 capacitor 26 was obtained and stored in the oscillation detector 18 during the initial system calibration. For a crystal oscillator with load capacitance of 15 picoFarads (pF), for example, the C2 is fixed at 30 pF, while the C1 is programmed to an initial value of 3 pF to 6 pF, 12 pF, 18 pF, 24 pF and then 30 pF.

To merely serve as a measure of comparison, numbers are presented for the purpose of noting the improvement of the embodiment of FIG. 1 over prior art. A typical prior art oscillation circuit is known to have a start-up time of approximately 0.9 milliseconds whereas the embodiment of FIG. 1 is known to have a start-up time approximately of 0.04 milliseconds. Furthermore, conventional systems require approximately 1.5 milliseconds to reach a desired frequency and maintain stability, whereas, the embodiment of FIG. 1, has demonstrated approximately 0.2 milliseconds to have the signal 32 reach a desired frequency and to remain stable thereat. Moreover, as previously stated, an inexpensive crystal resonator may be employed while achieving greater system performance. Due to faster start-up times, a 'deep sleep' mode may be entered more frequently, relative to prior art systems thereby reducing power consumption.

Figure 2:
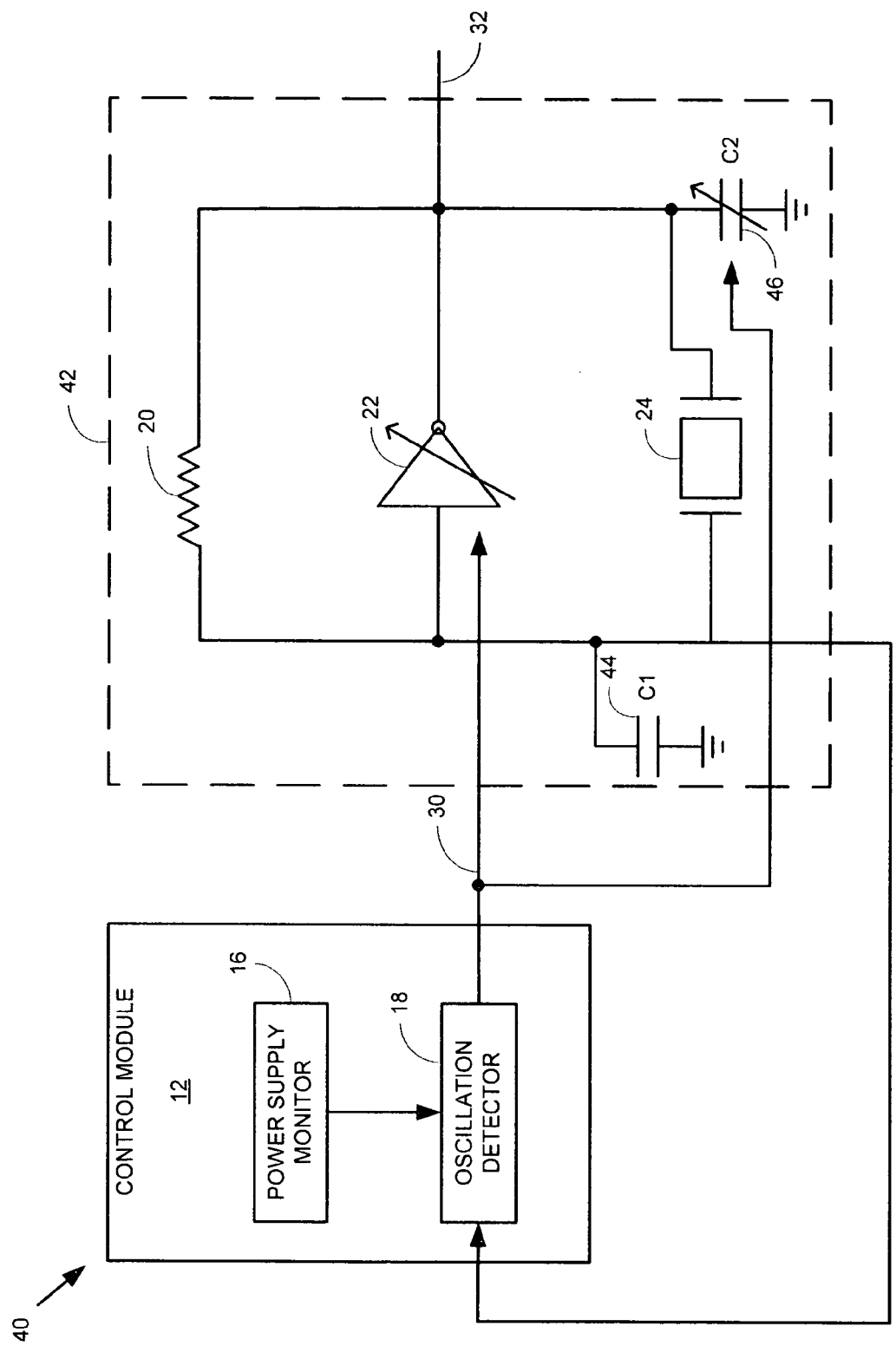
FIG. 2 shows a frequency generation circuit 40 in accordance with an alternative embodiment of the present invention.

FIG. 2 shows a frequency generation circuit 40 in accordance with an alternative embodiment of the present invention. The structures shown in FIG. 2 are similar to that of FIG. 1 except that an oscillator circuit 42 is shown to include a C1 capacitor 44 being fixed in capacitance and the C2 capacitor 46 being programmable as the C1 capacitor 26 of FIG. 1. In this case, as the ratio C2/C1 still determines the start-up time of the oscillator circuit 42. However, in this case, the C2 capacitor is initially programmed to high capacitance value and then lowered to achieve a desired frequency but the current driving the amplifier 22 remains changed as discussed above.

Figure 3:
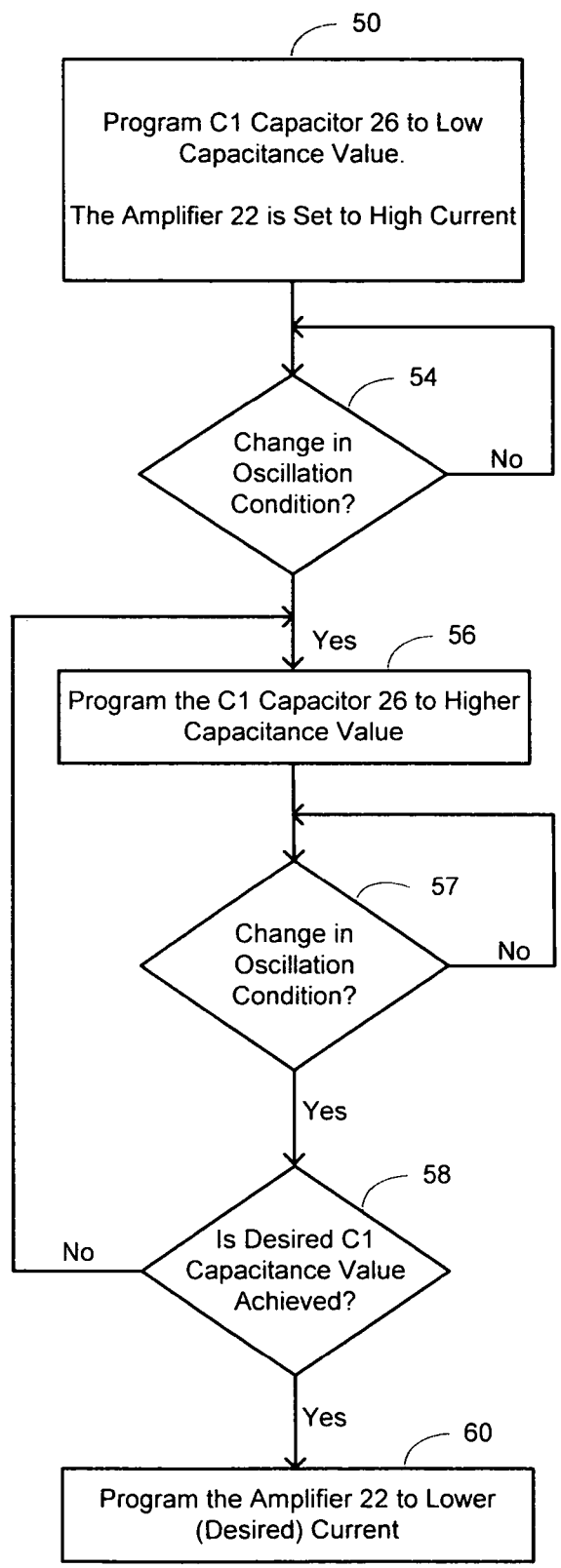
FIG. 3 shows a flow chart of the steps performed by the frequency generation circuit 10 of FIG. 1.

FIG. 3 shows a flow chart of the steps performed by the frequency generation circuit 10 of FIG. 1. At step 50, the C1 capacitor 26 is programmed to a low capacitance value, such as 3 pF and the amplifier 22 is driven to a high current state by the control module 12. Next, at 54, the oscillation detector 18 monitors the oscillation signal condition through the input of the amplifier and determines whether or not there is any change in the oscillation condition of the frequency generation circuit 14. If it is determined that the oscillation signal has been increased to a required level, the process continues forward to step 56 at which time the C1 capacitor 26 is programmed, by the control module 12, to a capacitance value that is higher than the initial value set at step 50. If, at 54, it is determined that the oscillation signal has not been increased to the requisite level, the process continues back to 54 until the requisite level is determined to have been achieved.

After increasing the capacitance of the C1 capacitor 26, in step 56, the process continues to step 57, which is similar to step 54, for monitoring the oscillation condition. If, at 57, it is determined that the oscillation condition has not reached the required level, the process continues to stay at 57 until the oscillation condition has reached the required level.

Next, at 58, a determination is made as to whether or not the C1 capacitor 26 has reached a desired capacitance value. It should be noted that a desired capacitance value is determined by the desired frequency that the signal 32 is expected to achieve. If it is determined that the capacitance, C1, of the C1 capacitor 26 has reached the desired value, the process continues to step 60, otherwise, the process goes back to step 56 programming the C1 capacitor 26 to a higher value until the desired capacitance is attained. At step 60, the amplifier 22 is programmed to a lower current by the control module 12, which has the effect of lower power consumption and a higher quality of performance.

Figure 4:
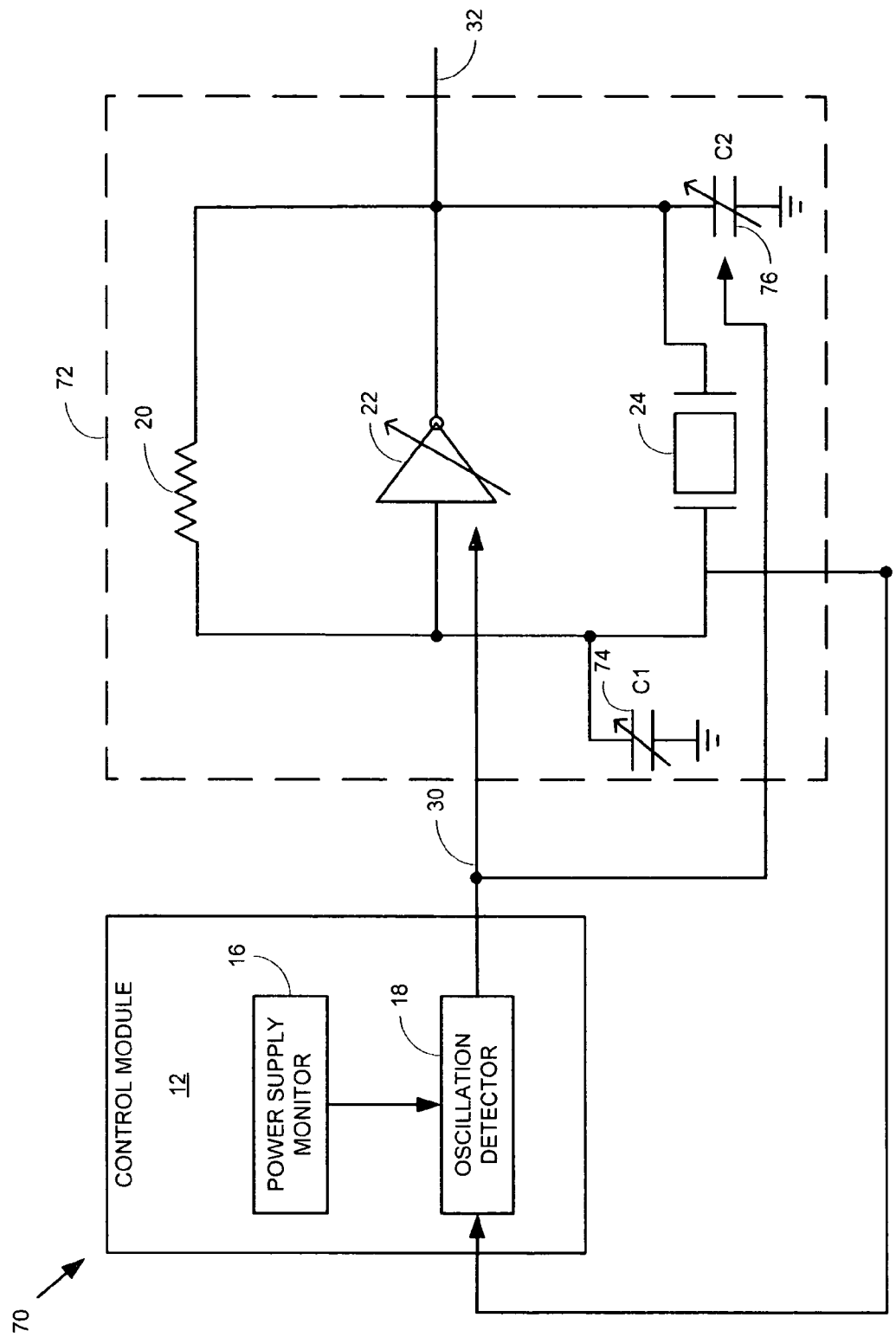
FIG. 4 shows a frequency generation circuit 70 in accordance with an alternative embodiment of the present invention.

FIG. 4 shows a frequency generation circuit 70 in accordance with another alternative embodiment of the present invention. The structures shown in FIG. 3 are similar to that of FIG. 1 except that an oscillator circuit 72 is shown to include a C1 capacitor 74 being programmable and C2 capacitor 76 being programmable.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A frequency generation circuit comprising:
   a control module adaptive to generate a control signal; and an oscillator circuit responsive to said control signal and adaptive to generate an output signal having a desired frequency, the oscillator circuit having a start-up time defined by the time required to reach the desired frequency and including,
   an amplifier having an input and an output and being programmably-alterable by the control module, as to its amplification,
   a first capacitor coupled, on one end, to the input of the amplifier and on an opposite end to ground and being programmably-alterable, in capacitance, by the control module,
   a second capacitor coupled, on one end, to the output of the amplifier and on an opposite end to ground, the first and second capacitors causing calibration of frequency to attain the desired frequency and further defining the startup time,
   a crystal resonator, having lower accuracy, coupled to the first and second capacitors for generating the output signal,
   wherein with detection of a change of oscillation condition, the start-up time of the oscillator is changed by adjusting the capacitance ratio based on the capacitance of the first and second capacitors to achieve fast start-up time and to thereafter gradually program the first capacitor value to achieve an accurate and desired frequency associated with the output signal while the drivability of the amplifier is altered to reduce power consumption by the oscillation circuit through the control signal,
   further wherein a lower accuracy crystal resonator is employed to save system cost while accurate frequency control is achieved.

2. A frequency generation circuit, as recited in claim 1, further including a power supply monitor for detecting a power supply power-on condition to generate a start-up signal to stimulate the oscillator so as to shorten the start-up time.

3. A frequency generation circuit, as recited in claim 2, wherein the control module further includes an oscillation detector adaptive to generate the control signal and coupled to the power supply monitor and to the first capacitor and the amplifier, the oscillation detector operative to detect the oscillation condition and to gradually adjust the capacitance of the first capacitor to preset calibrated values that determine the desired frequency.

4. A frequency generation circuit, as recited in claim 1, wherein the capacitance of the first capacitor, C1, and the capacitance of the second capacitor, C2, form a ratio, C2/C1, determining the start-up time.

5. A frequency generation circuit, as recited in claim 4, wherein the ratio of the second and first capacitor capacitances is temporarily set to a high value by setting the C1 low and eventually decreased by setting C1 to a higher value to effectuate fast start-up time.

6. A frequency generation circuit, as recited in claim 1, wherein a feedback resistor is coupled to the amplifier.

7. A frequency generation circuit, as recited in claim 1, wherein an output signal is generated by the amplifier for use by electronic circuits and having the desired frequency.

8. An oscillator circuit configured to generate an output signal, the oscillator circuit having a start-up time defined by the time required to reach a desired frequency of the output signal and comprising:
   an amplifier having an input and an output and being programmably-alterable, as to its amplification, through a control signal;
   a first capacitor coupled, on one end, to the input of the amplifier, and on an opposite end to ground, and being programmably-alterable, in capacitance;
   a second capacitor coupled, on one end, to the output of the amplifier, and on an opposite end to ground, the first and second capacitors defining a start-up time and frequency calibration to reach a desired frequency; and
   a crystal resonator coupled to the first and second capacitors for generating an output signal having a desired frequency, wherein fast start-up time is achieved, and further wherein as detection of change of oscillation condition is noted, the capacitance of the first capacitor to caused to change, through the control signal, so as to gradually program the capacitance to higher values and to ultimately a preset calibrated value for the desired frequency at the output signal while the amplification of the amplifier is programmed to alter drivability of the amplifier through the control signal.

9. An oscillator circuit, as recited in claim 8, wherein the capacitance of the first capacitor, C1, and the capacitance of the second capacitor, C2, form a ratio, C2/C1, determining the start-up time.

10. An oscillator circuit, as recited in claim 9, wherein the ratio C2/C1 is initially set to a high value by setting the C1 low and eventually decreased by setting C1 to a higher value to effectuate fast start-up time.

11. An oscillator circuit, as recited in claim 8, wherein a feedback resistor is coupled to the amplifier.

12. A method of using an oscillation circuit to achieve fast start-up time for reaching a desired frequency comprising:
   setting the capacitance value of a first capacitor to C1 and the capacitance value of a second capacitor to C2, the ratio C1 to C2 used in determining the start-up time while predetermined capacitance values determines the desired frequency;
   programming the capacitance of a first capacitor to a low value for fast start-up time;
   programming the capacitance of a second capacitor to a high value for fast start-up time;
   altering the drivability of an amplifier to have high current temporarily for fast start-up time;
   detecting a change in the oscillation condition;
   re-programming the capacitance of the first capacitor to a desired value for high frequency accuracy;
   re-programming the capacitance of the second capacitor to a desired value for high frequency accuracy; and
   modifying the amplifier drivability to achieve high quality output waveform and low operating power.

13. A frequency generation circuit comprising:
   a control module adaptive to generate a control signal; and
   oscillator means responsive to said control signal and adaptive to generate an output signal having a desired frequency, the oscillator means having a start-up time defined by the time required to reach the desired frequency and including,
   an amplifier having an input and an output and being programmably-alterable by the control module,
   a first capacitor coupled, on one end, to the input of the amplifier and, on an opposite end to ground, and being programmably-alterable, in capacitance, by the control module,
   a second capacitor coupled, on one end, to the output of the amplifier and, on an opposite end, to ground, the first and second capacitors causing calibration of frequency to attain the desired frequency and further defining the startup time, a crystal resonator coupled to the first and second capacitors for generating the output signal, wherein the control module further includes a power supply monitor for detecting a power supply power-on condition and for generating a start-up signal to stimulate the oscillator so as to speed up the start-up time and wherein the control module further includes an oscillation detector coupled to the power supply monitor and to the first capacitor and the amplifier, the oscillation detector operative to detect the oscillation condition and to gradually adjust the capacitance value, C1, of the first capacitor, to a predetermined calibrated value that determines a desired frequency.

14. A frequency generation circuit, as recited in claim 13, wherein the capacitance of the first capacitor, C1, and the capacitance of the second capacitor, C2, form a ratio, C2/C1, determining the start-up time.

15. A frequency generation circuit, as recited in claim 14, wherein the ratio C2/C1 is initially set to a high value by setting the C1 low to a higher value to effectuate fast start-up time.

16. A frequency generation circuit, as recited in claim 13, wherein a shunt resistor is coupled to the amplifier.

17. A frequency generation circuit, as recited in claim 13, wherein an output signal is generated by the amplifier for use by electronic circuits and having the desired frequency.

18. A frequency generation circuit comprising:

a control module adaptive to generate a control signal; and an oscillator circuit responsive to said control signal and adaptive to generate an output signal having a desired frequency, the oscillator circuit having a start-up time defined by the time required to reach the desired frequency and including, an amplifier having an input and an output and being programmably-alterable by the control module, as to its amplification, a first capacitor coupled, on one end, to the input of the amplifier and on an opposite end to ground and being programmably-alterable, in capacitance, by the control module, a second capacitor coupled, on one end, to the output of the amplifier and on an opposite end to ground and being programmably-alterable, in capacitance, by the control module, the first and second capacitors causing calibration of frequency to attain the desired frequency and further defining the startup time, a crystal resonator, having lower accuracy, coupled to the first and second capacitors for generating the output signal, wherein as detection of change of oscillation condition is detected, the start-up time of the oscillator is changed by adjusting the capacitance ratio based on the capacitance of the first and second capacitors, and the control module programs the first and second capacitors to change, through the control signal, so as to gradually program the first and second capacitors to a preset calibrated value which determines a desired frequency associated with the output signal while the drivability of the amplifier is altered to reduce power consumption by the oscillation circuit through the control signal, further wherein a lower accuracy crystal resonator is employed to save system cost while accurate frequency control is achieved.

19. A frequency generation circuit, as recited in claim 1, wherein the second capacitor is programmably-alterable in capacitance.

20. A frequency generation circuit, as recited in claim 1, further including an oscillator detector coupled to the amplifier and operative to detect the oscillation condition to adjust the capacitance value of the first capacitor to gradually increase when the oscillation detector detects an predetermined increase in the level of an oscillator signal.

* * * * *